United States Patent
Shirotori et al.

(10) Patent No.: US 10,170,694 B1
(45) Date of Patent: Jan. 1, 2019

(54) MAGNETIC MEMORY

(71) Applicant: KABUSHIKI KAISHA TOSHIBA, Minato-ku (JP)

(72) Inventors: Satoshi Shirotori, Yokohama (JP); Yuichi Ohsawa, Yokohama (JP); Hideyuki Sugiyama, Kawasaki (JP); Mariko Shimizu, Nerima (JP); Altansargai Buyandalai, Kawasaki (JP); Naoharu Shimomura, Meguro (JP); Katsuhiko Koui, Yokohama (JP); Tomoaki Inokuchi, Yokohama (JP); Hiroaki Yoda, Kawasaki (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/911,341

(22) Filed: Mar. 5, 2018

(30) Foreign Application Priority Data

Sep. 20, 2017 (JP) .................................. 2017-180662

(51) Int. Cl.
*H01L 43/02* (2006.01)
*H01L 43/08* (2006.01)
(Continued)

(52) U.S. Cl.
CPC ............ *H01L 43/08* (2013.01); *G11C 11/161* (2013.01); *H01L 27/222* (2013.01); *H01L 43/02* (2013.01);
(Continued)

(58) Field of Classification Search
CPC ......... H01L 43/12; H01L 43/08; H01L 29/82; H01L 27/222; H01L 43/02; H01L 43/04
See application file for complete search history.

(56) References Cited

U.S. PATENT DOCUMENTS 9,076,537 B2 7/2015 Khvalkovskiy et al.
2010/0080050 A1* 4/2010 Ozeki .................... B82Y 25/00
365/158
(Continued)

FOREIGN PATENT DOCUMENTS

JP 2014-45196 3/2014
JP 2017-59679 3/2017

OTHER PUBLICATIONS

Jiawei Yu et al. "Large Spin-Orbit Torques in Pt/Co-Ni/W Heterostructures", Applied Physics Letters, vol. 109, 2016, 6 pages.
(Continued)

*Primary Examiner* — Jaehwan Oh
(74) *Attorney, Agent, or Firm* — Oblon, McClelland, Maier & Neustadt, L.L.P.

(57) ABSTRACT

A magnetic memory of an embodiment includes: a first conductive layer, which is nonmagnetic and includes at least a first element, the first conductive layer including a first to fifth regions; a first magnetoresistive element disposed corresponding to the third region and including a first magnetic layer, a second magnetic layer including at least a second element, a first nonmagnetic layer disposed between the first magnetic layer and the second magnetic layer, a second nonmagnetic layer disposed between the second magnetic layer and the first nonmagnetic layer and including at least a third element, and a third magnetic layer disposed between the second nonmagnetic layer and the first nonmagnetic layer; a second conductive layer disposed corresponding to the second region and including at least the first to third elements; and a third conductive layer disposed corresponding to the fourth region, and including at least the first to third elements.

9 Claims, 5 Drawing Sheets

(51) Int. Cl.
*G11C 11/16* (2006.01)
*H01L 27/22* (2006.01)
*H01L 43/12* (2006.01)
*H01L 43/10* (2006.01)

(52) U.S. Cl.
CPC ....... *G11C 11/1673* (2013.01); *G11C 11/1675* (2013.01); *H01L 43/10* (2013.01); *H01L 43/12* (2013.01)

(56) References Cited

U.S. PATENT DOCUMENTS

| | | | | |
|---|---|---|---|---|
| 2012/0244639 | A1* | 9/2012 | Ohsawa | H01L 43/12 438/3 |
| 2012/0244640 | A1* | 9/2012 | Ohsawa | H01L 43/12 438/3 |
| 2013/0029431 | A1* | 1/2013 | Takahashi | H01L 43/12 438/3 |
| 2013/0069182 | A1* | 3/2013 | Ohsawa | H01L 29/82 257/421 |
| 2014/0087483 | A1* | 3/2014 | Ohsawa | H01J 37/08 438/3 |
| 2014/0284739 | A1* | 9/2014 | Mani | G11C 8/00 257/421 |
| 2016/0196951 | A1* | 7/2016 | Ohsawa | H01J 37/30 250/492.3 |
| 2016/0197268 | A1* | 7/2016 | Yakabe | H01L 43/08 257/421 |
| 2016/0276574 | A1* | 9/2016 | Ohsawa | H01L 43/08 |
| 2017/0077177 | A1 | 3/2017 | Shimomura et al. | |
| 2017/0148978 | A1 | 5/2017 | Apalkov et al. | |
| 2018/0076261 | A1* | 3/2018 | Yoshikawa | H01L 27/222 |
| 2018/0174634 | A1* | 6/2018 | Kato | G11C 11/1655 |

OTHER PUBLICATIONS

H. Yoda et al. "Voltage-Control Spintronics Memory (VoCSM) Having Potentials of Ultra-Low Energy-Consumption and High-Density", IEDM 2016 Digest, 2016, 4 pages.

Satoshi Yakata et al. "Thermal Stability and Spin-Transfer Switching in MgO-based Magnetic Tunnel Junctions with Ferromagnetically and Antiferromagnetically Coupled Synthetic Free Layers", Applied Physics Letters, vol. 95, 2009, 3 pages.

Satoshi Yakata et al. "Enhancement of Thermal Stability Using Ferromagnetically Coupled Synthetic Free Layers in MgO-Based Magnetic Tunnel Junctions", IEEE Transactions on Magnetics, vol. 46, No. 6, Jun. 2010, pp. 2232-2235.

* cited by examiner

MAGNETIC MEMORY

CROSS REFERENCE TO RELATED APPLICATIONS

This application is based upon and claims the benefit of priority from the prior Japanese Patent Application No. 2017-180662, filed on Sep. 20, 2017, the entire contents of which are incorporated herein by reference.

FIELD

Embodiments described herein relate generally to magnetic memories.

BACKGROUND

Magnetic memories, in particular magnetic random access memories (MRAMs), are attracting attention due to their potential for high-speed read operation, high-speed write operation, superior durability, nonvolatile property, and low power consumption during operation. The MRAMs are nonvolatile memories that operate based on the giant magneto resistive effect (GMR) or the tunnel magneto resistance effect (TMR), and store data using a magnetic material as a medium for recording and retaining data. Magnetic members included in memory devices are being miniaturized in order to increase the memory density. As the magnetic members are miniaturized, the magnetic field used in an operation of the memories needs to be applied to the minute magnetic members. However, it is difficult to locally generate a magnetic field since the magnetic field tends to spread to the space. If the size of the magnetic field source is deceased to form a local magnetic field, the size of the local magnetic field may not be satisfactory to control the direction of the magnetization of the magnetic material.

In order to solve this problem of the MRAMs, such memories are known as spin transfer torque magnetic random access memories (STT-MRAMs), in which the direction of magnetization of a magnetic member is switched by causing a current to flow through the magnetic member, spin-hall effect magnetic random access memories (SHE-MRAMs), in which the direction of magnetization is switched by causing a current to flow through a nonmagnetic heavy metal that provides a great spin Hall effect, voltage-control magnetic random access memories (VC-MRAMs), in which a write operation is performed by using a voltage control magnetic anisotropy effect, and the number of electrons in the magnetic member is changed by applying a voltage to a magnetic tunnel junction (MTJ), thereby changing the magnetization characteristics, and voltage-control spintronics memories (VoCSMs) using the spintronics technology, in which SHE-MRAMs are arranged in a string structure and the VCMA effect is used to select the bit on which a write operation is performed. The above methods are expected to locally control the magnetization state in the nano-scale magnetic member, and to reduce the value of the current for switching the magnetization as the size of the magnetic material is reduced.

In the STT-MRAM method, the same terminals are used for a write operation and a read operation, and a large current is used for the write operation and a small current is used for the read operation to prevent the magnetization switching (writing) caused by the read current.

In the SHE-MRAMs, terminals for a write current may be separated from terminals for a read current. Therefore, these memories are expected to reduce the write error rate (WER).

The VoCSMs have a string structure in which SHE-MRAMs having three terminals and a large cell size are connected. Therefore, these memories are expected to be highly integrated. As memory elements are miniaturized and highly integrated, the influence of the leakage magnetic field from the storage layer on adjacent memory elements increases, which increases the write error rate. Therefore, the storage layer needs to have a synthetic anti-ferromagnetic (SAF) structure which generates less leakage magnetic field and thus may suppress the increase in write error rate caused by the leakage magnetic field. It is known that if the storage layer is sandwiched by conductive layers with opposite spin Hall angles, and a current is caused to flow these conductive layers, the magnetization switching efficiency is improved by the spin Hall effect. The improve in magnetization switching efficiency leads to a decrease in write current, and therefore a decrease in power consumption. However, it has been difficult to cause a current to flow through the layers on and under the storage layer.

DETAILED DESCRIPTION

Hereinafter, embodiments will be described in detail with reference to the accompanying drawings.

A magnetic memory according to an embodiment includes: a first terminal and a second terminal; a first conductive layer, which is nonmagnetic and includes at least a first element, the first conductive layer including a first region, a second region, a third region, a fourth region, and a fifth region, the second region being disposed between the first region and the fifth region, the third region being disposed between the second region and the fifth region, the fourth region being disposed between the third region and the fifth region, the first region being electrically connected to the first terminal, and the fifth region being electrically connected to the second terminal; a first magnetoresistive element disposed to correspond to the third region, the first magnetoresistive element including a first magnetic layer, a second magnetic layer disposed between the first magnetic layer and the third region and including at least a second element, a first nonmagnetic layer disposed between the first magnetic layer and the second magnetic layer, a second nonmagnetic layer disposed between the second magnetic layer and the first nonmagnetic layer and including at least a third element, and a third magnetic layer disposed between the second nonmagnetic layer and the first nonmagnetic layer; a second conductive layer disposed to correspond to the second region, electrically connected to the second region, the second magnetic layer, and the second nonmagnetic layer, and including at least the first element, the second element, and the third element; and a third conductive layer disposed to correspond to the fourth region, electrically connected to the fourth region, the second magnetic layer, and the second nonmagnetic layer, and including at least the first element, the second element, and the third element.

First Embodiment

Figure 1:
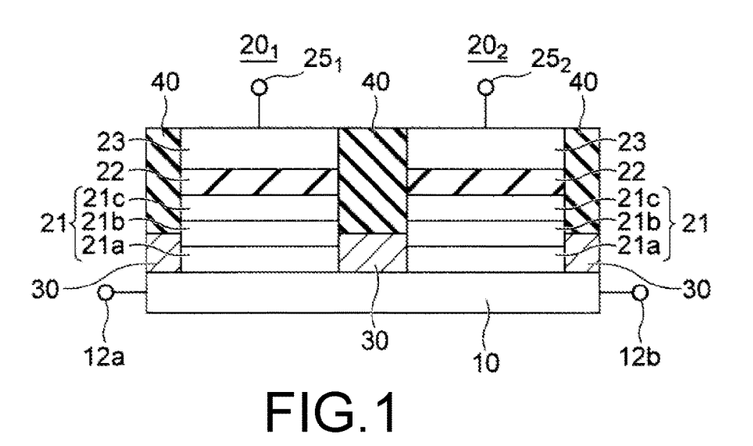
FIG. 1 is a cross-sectional view of a magnetic memory according to a first embodiment.

FIG. 1 is a cross-sectional view of a magnetic memory according to a first embodiment. The magnetic memory according to this embodiment includes a memory element $20_1$ and a memory element $20_2$ disposed on a nonmagnetic conductive layer (first conductive layer) 10. Each memory element $20_i$ (i=1, 2) has a multilayer structure including a storage layer 21 which is disposed on the conductive layer 10 and in which the magnetization direction may be changed, a nonmagnetic layer (first nonmagnetic layer) 22 disposed on the storage layer 21, and a reference layer (first magnetic layer) 23 which is disposed on the nonmagnetic layer 22 and in which the magnetization direction is fixed. Thus, the multilayer structure includes the reference layer (first magnetic layer) 23, the storage layer 21 disposed between the conductive layer 10 and the reference layer 23, and the nonmagnetic layer 22 disposed between the reference layer 23 and the storage layer 21. If the nonmagnetic layer 22 is formed of an insulating material, the multilayer structure is an MTJ element, and if the nonmagnetic layer 22 is formed of a conductive metal, the multilayer structure is a GMR element. If the magnetization direction of the reference layer 23 and the magnetization direction of the storage layer 21 are parallel to each other, the electric resistance of the memory elements $20_1$ and $20_2$ is low ($R_P$), and if they are antiparallel to each other, the electric resistance of the memory elements $20_1$ and $20_2$ is high ($R_{AP}$). These states are retained after the power supply is stopped. Therefore, the stored data is nonvolatile.

In this embodiment, the storage layer 21 includes a magnetic layer (second magnetic layer) 21a disposed on the conductive layer 10, a nonmagnetic layer (second nonmagnetic layer) 21b disposed on the magnetic layer 21a, and a magnetic layer (third magnetic layer) 21c disposed on the nonmagnetic layer 21b. The magnetic layer 21a and the magnetic layer 21c are coupled by synthetic antiferromagnetic coupling via the nonmagnetic layer 21b. Therefore, the magnetization direction of the magnetic layer 21a and the magnetization direction of the magnetic layer 21c are antiparallel to each other. In this embodiment, the state that the magnetization direction of the reference layer 23 and the magnetization direction of the storage layer 21 are parallel to each other means that the magnetization direction of the reference layer 23 and the magnetization direction of the magnetic layer 21c are parallel to each other, and the state that the magnetization direction of the reference layer 23 and the magnetization direction of the storage layer 21 are antiparallel to each other means that the magnetization direction of the reference layer 23 and the magnetization direction of the magnetic layer 21c are antiparallel to each other.

Nonmagnetic conductive layers (second conductive layer and third conductive layer) 30 are disposed on regions of the conductive layer 10 on both sides of each memory element $20_i$ (i=1, 2) in this embodiment. The conductive layers 30 are disposed below the interface between the storage layer 21 and the nonmagnetic layer 22 in each memory element $20_i$ (i=1, 2). The height (maximum height) of each conductive layer 30 is lower than a height from the conductive layer 10 to the interface between the magnetic layer 21c and the nonmagnetic layer 22, and higher than a height from the conductive layer 10 to the interface between the magnetic layer 21a and the nonmagnetic layer 21b. This structure prevents a short-circuit of the magnetic layer 21c and the reference layer 23, and enables a write current not only to flow through the conductive layer 10 immediately below the magnetic layer 21a but also to flow through the nonmagnetic layer 21b via the conductive layers 30.

An insulating layer 40 is disposed on each conductive layer 30. The insulating layer 40 isolates the memory element $20_1$ and the memory element $20_2$ from each other.

Figure 3:
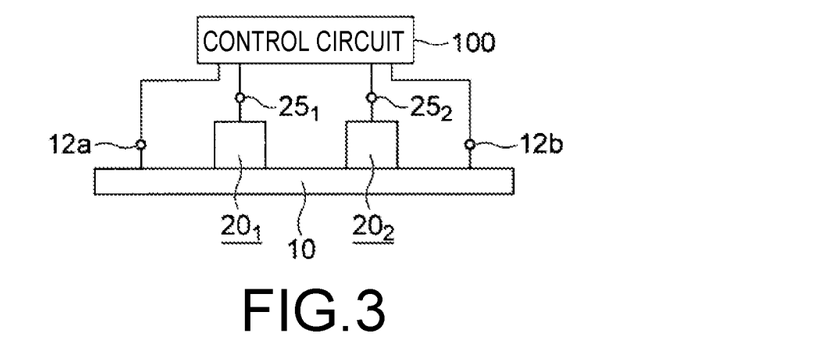
FIG. 3 is a block diagram of the magnetic memory according to the first embodiment.

A first terminal 12a and a second terminal 12b are electrically connected to the conductive layer 10. A terminal $25_i$ is electrically connected to the reference layer 23 of each memory element $20_i$ (i=1, 2). The first terminal 12a, the second terminal 12b, and the terminals $25_1$ and $25_2$ are electrically connected to a control circuit 100, as shown in FIG. 3.

In the magnetic memory according to this embodiment, the conductive layers 30 is disposed on the both sides of the memory element $20_i$ (i=1, 2). The conductive layer 30 contains the same materials as the material of the nonmagnetic layer 21b, the material of the magnetic layer 21a, and the material of the conductive layer 10. The formula $\rho_{NM1} > \beta_{LEAD} > \beta_{CL} > \beta_{NM2}$ preferably holds where $\rho_{CL}$ is the resistivity of the conductive layer 30, $\rho_{NM2}$ is the resistivity of the nonmagnetic layer 22, $\rho_{LEAD}$ is the resistivity of the nonmagnetic layer 21b, and $P_{LEAD}$ is the resistivity of the conductive layer 10. The above formula holds if the resistivity $\rho_{LEAD}$ of the material of the conductive layer 10 is higher than the resistivity $\rho_{NM2}$ of the nonmagnetic layer 21b.

The memory elements normally are entirely covered with an insulating material to be isolated from each other. However, the write current flows not only through the conductive layer 10 but also through the nonmagnetic layer 21b in each memory element in this embodiment. Therefore, the above relationship is preferably satisfied in this embodiment.

Figure 2:
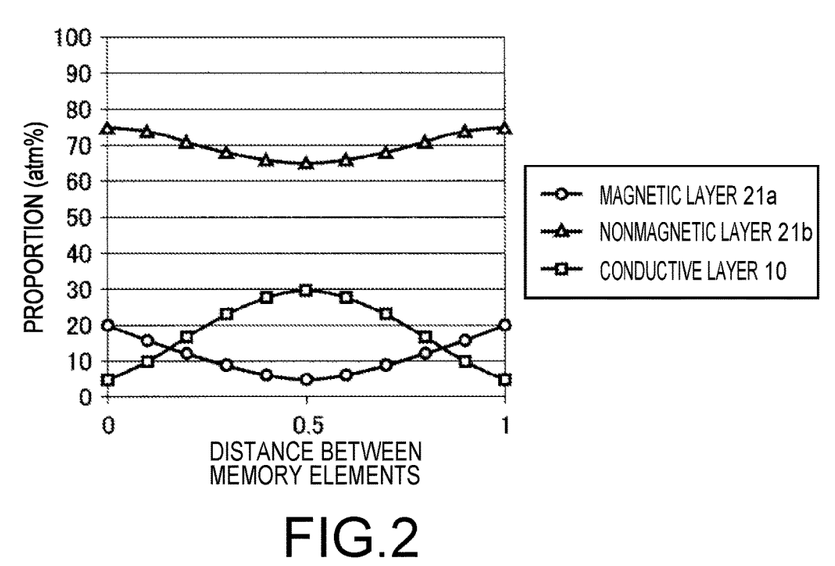
FIG. 2 is a diagram showing changes in proportion of the materials included in the conductive layer in response to the distance from the memory elements.

The conductive layer 30 disposed between adjacent memory elements is formed of a mixture of the materials of the nonmagnetic layer 21b, the magnetic layer 21a, and the conductive layer 10. This prevents a rapid change in resistivity, thermal expansion, and stress, and therefore prevents damage to the magnetic layer 21a. Therefore, as shown in FIG. 2, the proportion (concentration) of an element (second element) included in the material of the magnetic layer 21a decreases from a side close to the memory element to a side distant from the memory element in the conductive layer 30. Thus, as can be understood from FIG. 2, the proportion (concentration) of the element (second element) included in the material of the magnetic layer 21a is the lowest around the midpoint of the distance between the memory elements. This tendency can be found for the proportion (concentration) of the element (third element) included in the material of the nonmagnetic layer 21b. The proportion (concentration) of the element (first element) included in the material of the conductive layer 10 increases from the side close to the memory element to the side distant from the memory element in the conductive layer 30. Thus, as can be understood from FIG. 2, the proportion (concentration) of the element (first element) included in the material of the conductive layer 10 is the highest around the midpoint of the distance between the memory elements. In FIG. 2, the horizontal axis indicates the normalized distance from the memory element $20_1$ to the adjacent memory element $20_2$ in a direction along which the conductive layer 10 extends, and the vertical axis indicates the proportion (atm %) of the respective elements. The thickness of the conductive layer 30 disposed between the memory element $20_1$ and the memory element $20_2$ is the thinnest around the midpoint between the memory element $20_1$ and the memory element $20_2$, and increases from the midpoint toward the memory element $20_1$ and the memory element $20_2$, although this is not shown in FIG. 2.

As will be described later, if a material that is relatively hard to be ionized is used for the nonmagnetic layer 21b, damage to the magnetic layer 21a, such as oxidizing and nitriding, may be prevented. The insulating layer 40 filled in the region higher than the nonmagnetic layer 22 between the memory elements may prevents the short-circuit of the storage layer 21 and the reference layer 23, and therefore prevents the degradation of the magnetoresistance effect of the memory elements.

(Write Operation)

When a write current Iw flows through the conductive layer 10 between the first terminal 12a and the second terminal 12b, the write current Iw also flows through the nonmagnetic layer 21b of each of the memory elements $20_1$ and $20_2$ via the conductive layers 30. As a result, the spin orbit torque (SOT) is applied to the storage layers 21 of the memory elements $20_1$ and $20_2$ from not only the conductive layer 10 but also the nonmagnetic layer 21b. Therefore, the magnetization direction of the storage layers 21, namely the magnetization direction of the magnetic layers 21a, may be changed more easily than the case where the SOT is applied only from the conductive layer 10. Thus, the write operation in this embodiment may be performed with a lower write current. This leads to a lower power consumption.

The direction of the SOT applied to the storage layers 21 in the case where the write current Iw flows from the first terminal 12a to the second terminal 12b is opposite to the case where the write current Iw flows from the second terminal 12b to the first terminal 12a. Therefore, the magnetization direction of the storage layers 21 after the write operation in the former case is opposite to that in the latter case. The write current Iw is supplied from the control circuit 100 shown in FIG. 3.

In the write operation, different voltages may be applied to the terminals $25_1$ and $25_2$ electrically connected to the respective reference layers 23 of the memory elements $20_1$ and $20_2$ to control the magnetic anisotropy so that data is written to the storage layer 21 of only one of the memory elements $20_1$ and $20_2$. The voltages applied to the terminals $25_1$ and $25_2$ are supplied by the control circuit 100.

(Read Operation)

Data is read from a memory element, for example the memory element $20_1$, by causing a read current to flow between the terminal $25_1$ of the memory element $20_1$ and one of the first terminal 12a and the second terminal 12b. The read current is supplied from the control circuit 100. As in the write operation, in the read operation, different voltages may be applied to the terminals $25_1$ and $25_2$ electrically connected to the respective reference layers 23 of the memory elements $20_1$ and $20_2$ to control the magnetic anisotropy, so that data is read from the storage layer 21 of only one of the memory elements $20_1$ and $20_2$, and no data is erroneously written to the storage layer 21 of the other. As in the case of the write operation, the voltages applied to the terminals $25_1$ and $25_2$ are supplied by the control circuit 100.

(Materials of Constituent Elements)

Materials of the respective constituent elements of the magnetic memory are described below.

The conductive layer 10 is preferably formed of a material with a high spin Hall effect. For example, a material with a negatively large spin Hall angle such as β-Ta (tantalum), or β-W (tungsten) may be used. A material with a positively large spin Hall angle such as platinum (Pt) or gold (Au) may also be used.

The nonmagnetic layer 22 is formed of, for example, magnesium oxide (MgO). When an insulating material such as MgO is used, the nonmagnetic layer 22 is called "tunnel barrier layer." The MgO layer has a thickness of 10 Å (1 nm), for example. Other examples of the material of the nonmagnetic layer 22 include calcium oxide (CaO), strontium oxide (SrO), titanium oxide (TiO), vanadium oxide (VO), niobium oxide (NbO), and aluminum oxide ($Al_2O_3$).

A nitride of Mg or Al may also be used to form the nonmagnetic layer 22. The nonmagnetic layer 22 is not only limited to a single oxide or nitride layer, and may have a multilayer structure including layers of these insulating materials. The MgO layer has a sodium chloride (NaCl) crystal structure. A spinel type material such as $MgAl_2O_4$, which has a crystal orientation like MgO, may also be used.

The storage layer 21 has a synthetic structure including a magnetic layer 21a, a magnetic layer 21c, and a nonmagnetic layer 21b sandwiched between the magnetic layer 21a and the magnetic layer 21c. The magnetic layer 21c is disposed between the nonmagnetic layer 22 and the nonmagnetic layer 21b, and the magnetic layer 21a is disposed between the nonmagnetic layer 21b and the conductive layer 10. Examples of the material of the magnetic layer 21a and the magnetic layer 21c include ferromagnetic materials such as cobalt (Co), cobalt-iron-boron (CoFeB), or iron-boron (FeB).

Examples of the material of the nonmagnetic layer 21b include Ir, Ru, Pt, Pd, Ag, Au, Cu, Rh, or Bi, which are not easily ionized and have a large atomic number. The use of a material that is not easily ionized may prevent the magnetic layer 21a disposed below the nonmagnetic layer 21b from being subjected to damage caused by oxidizing or nitriding. If a material with a large atomic number is used to form the nonmagnetic layer 21b, a great spin Hall effect may be obtained from a great spin Hall angle. If the sign of the spin Hall angle of the material used to form the nonmagnetic layer 21b is opposite to that of the material used to form the conductive layer 10, the spin Hall effect may be more effectively obtained.

The layers in the synthetic structure may be coupled by the ferromagnetic coupling or antiferromagnetic coupling depending on the thickness of the nonmagnetic layer between the two magnetic layers. If the synthetic structure of the storage layer 21 is coupled by the ferromagnetic coupling, a high thermal stability may be obtained, but the influence of the leakage magnetic field on adjacent memory elements may be increased when the memory elements are highly integrated, which increases the WER.

If the layers of the synthetic structure in the storage layer 21 are coupled by the antiferromagnetic coupling (synthetic anti-ferromagnetic (SAF) structure), the two magnetic layers generate leakage magnetic fields in opposite directions. This reduces the influence of the leakage magnetic field on adjacent memory elements, and also reduces the variations in coercive force of the storage layer 21. However, the shape magnetic anisotropy in the storage layer 21 is also cancelled by the leakage magnetic fields. Therefore, a problem arises that satisfactory thermal stability may not be obtained. The thermal stability may be obtained by the shape magnetic anisotropy, the crystalline magnetic anisotropy, and the induced magnetic anisotropy. Since the spin Hall effect is obtained by effectively causing a current to flow through the nonmagnetic layer 21b in this embodiment, whether the ferromagnetic coupling or the antiferromagnetic coupling is performed does not matter. However, if the memory elements are highly integrated, the antiferromagnetic coupling is more preferred. Furthermore, the magnetic layer 21a preferably has a larger saturation magnetization than the magnetic layer 21c.

If the memory elements are VoCSM elements, with a CoFe/MgO structure for example, the number of electrons in the magnetic layer 21c that is in contact with the nonmagnetic layer 22 changes due to the oxygen in the nonmagnetic layer 22 when a voltage is applied. This is the VCMA effect. On the other hand, the spin Hall effect is given to the magnetic layer 21a that is in contact with the conductive layer 10. Therefore, if the product of the saturation magnetization Ms and the thickness t (=Ms·t) is the same for the magnetic layer 21c and the magnetic layer 21a, when the saturation magnetization of the magnetic layer 21c is increased, the thickness is decreased. Thus, the VCMA effect is effectively obtained at the interface with the nonmagnetic layer 22.

The reference layer 23 may be formed of cobalt (Co) or cobalt-iron-boron (CoFeB), and the magnetization of the reference layer 23 may be fixed by iridium-manganese (IrMn), which is an antiferromagnetic material and provides in-plane magnetization anisotropy to the reference layer 23. The reference layer 23 may have a synthetic structure.

If the reference layer 23 needs to have perpendicular magnetization, a magnetic layer of a rare earth metal-transition metal that has a small saturation magnetization $M_S$ and a large anisotropy magnetic field (hereinafter referred to as "rare earth metal-transition metal magnetic layer" or "ferrimagnetic layer") is used. Examples of the material of the rare earth metal-transition metal magnetic layer or ferrimagnetic layer are terbium-cobalt-iron (TbCoFe), an artificial superlattice in which Co and Pt are stacked, and a crystal material in which Fe and Pt are $L1_0$-ordered. A magnetic layer of CoFeB for example may be disposed between the reference layer 23 and the nonmagnetic layer 22 to improve the polarizability of the reference layer 23 to obtain a high magnetoresistance ratio (MR ratio).

As described above, the conductive layer 30 disposed on the conductive layer 10 side between the memory elements, and the insulating layer 40 disposed on the conductive layer 30 may curb the power consumption. Furthermore, the storage layer 21 with the synthetic antiferromagnetic coupling structure may curb the leakage magnetic field to adjacent memory elements. This may curb the write error rate even if the memory elements are highly integrated.

Second Embodiment

A method of manufacturing a magnetic memory according to a second embodiment will be described with reference to FIGS. 4A to 4D.

Figure 4A:
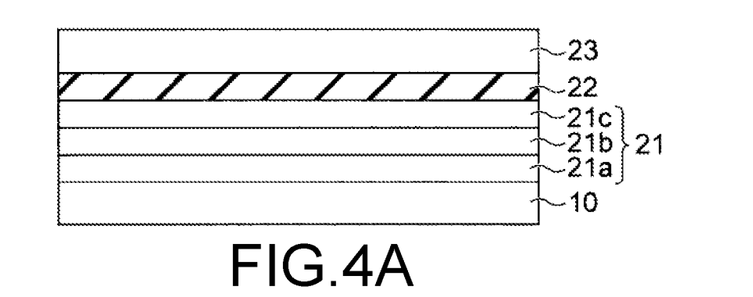
FIGS. 4A to 4D are cross-sectional views illustrating a method of manufacturing a magnetic memory according to a second embodiment.

First, as shown in FIG. 4A, a Ta layer 10 having a thickness of 5 nm is disposed as a conductive layer 10 on a substrate, which is not shown. Subsequently, a storage layer 21, a barrier layer 22, and a reference layer 23, which will serve as memory elements 20, are disposed on the Ta layer 10. The storage layer 21 includes a multilayer structure including a magnetic layer 21a, a nonmagnetic layer 21b, and a magnetic layer 21c stacked on the conductive layer 10 in this order, the magnetic layer 21a being a FeB layer having a thickness of 1.5 nm, the nonmagnetic layer 21b being a Ir layer having a thickness of 0.9 nm, and the magnetic layer 21c being a CoFeB layer having a thickness of 1 nm. The barrier layer 22 is a MgO layer having a thickness of 1 nm.

The reference layer 23 includes a multilayer structure including a CoFeB layer having a thickness of 1.5 nm, a Ru layer having a thickness of 0.9 nm, a CoFe layer having a thickness of 1.5 nm, and a IrMn layer having a thickness of 8 nm, the layers being stacked in this order from the barrier layer 22 side. Thus, the second embodiment has a structure providing synthetic antiferromagnetic coupling to the reference layer 23 of the magnetic memory according to the first embodiment shown in FIG. 1. With this structure, the leakage magnetic field to adjacent memory elements may be curbed, and the shift of magnetization characteristic of the storage layer included in the same memory element as the reference layer 23 may be prevented.

Figure 4B:
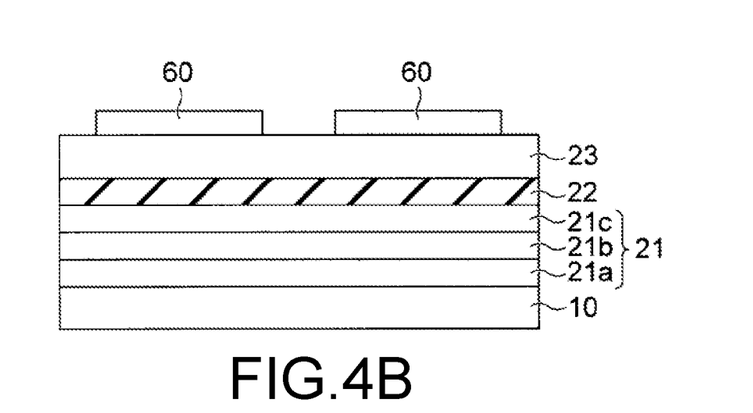
Figure 4C:
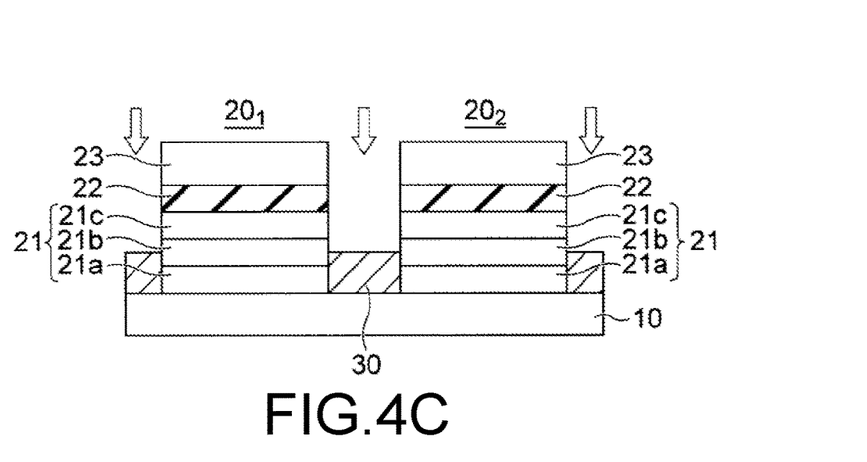

Masks 60 having a shape of the memory elements are then formed on the reference layer 23, as shown in FIG. 4B. The multilayer structure is then etched to the upper portion the nonmagnetic layer 21b by ion beam etching (IBE) using Ar gas to form the memory elements $20_1$ and $20_2$, as shown in FIG. 4C. The acceleration voltage of the IBE is set at 200 V so that Ir included in the nonmagnetic layer 21b, which has a large atomic number, is not etched, and injected into the magnetic layer 21a and the conductive layer 10. This forms a conductive layer 30 in the area between the memory elements below the nonmagnetic layer 22. The conductive layer 30 is formed of a mixture of materials of the nonmagnetic layer 21b, the magnetic layer 21a, and the conductive layer 10.

Figure 4D:
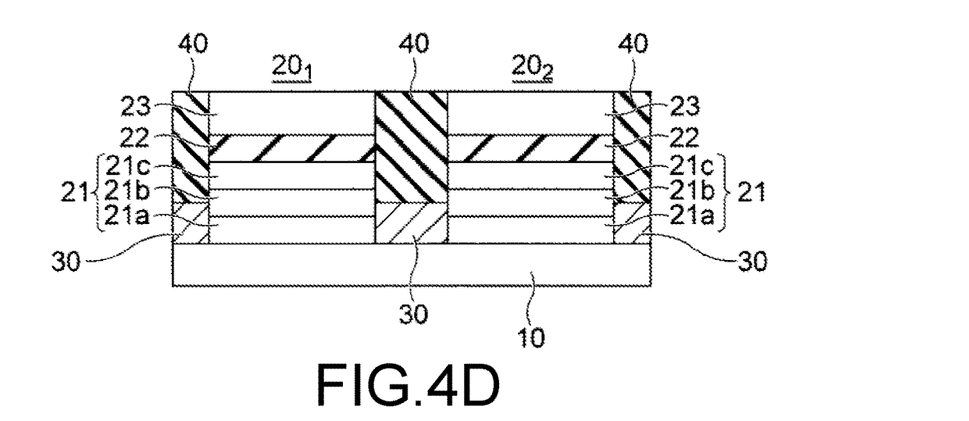

Then, an insulating layer 40 is embedded between the memory elements $20_1$ and $20_2$ to complete a magnetic memory in which an insulating layer is disposed on the conductive layer 30 (FIG. 4D).

The magnetic memory manufactured according to the second embodiment may curb the write error rate and the power consumption even if the memory elements are highly integrated, like the first embodiment.

Third Embodiment

A method of manufacturing a magnetic memory according to a third embodiment will be described with reference to FIGS. 5A to 5E.

Figure 5A:
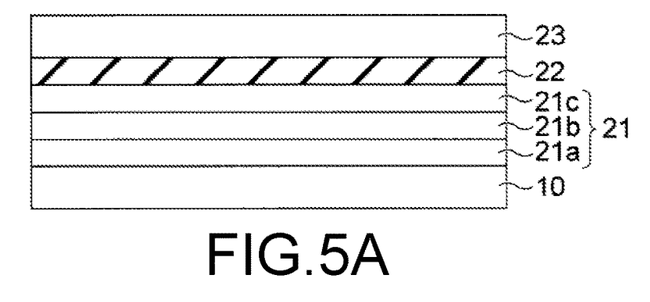
FIGS. 5A to 5E are cross-sectional views illustrating a method of manufacturing a magnetic memory according to a third embodiment.

First, as shown in FIG. 5A, a Ta layer 10 having a thickness of 5 nm is disposed as a conductive layer 10 on a substrate, which is not shown. Subsequently, a storage layer 21, a barrier layer 22, and a reference layer 23, which will serve as memory elements 20, are disposed on the Ta layer 10. The storage layer 21 includes a multilayer structure including a magnetic layer 21a, a nonmagnetic layer 21b, and a magnetic layer 21c stacked on the conductive layer 10 in this order, the magnetic layer 21a being a FeB layer having a thickness of 1.5 nm, the nonmagnetic layer 21b being a Ir layer having a thickness of 0.9 nm, and the magnetic layer 21c being a CoFeB layer having a thickness of 1 nm. The barrier layer 22 is a MgO layer having a thickness of 1 nm.

The reference layer 23 includes a multilayer structure including a CoFeB layer having a thickness of 1.5 nm, a Ru layer having a thickness of 0.9 nm, a CoFe layer having a thickness of 1.5 nm, and a IrMn layer having a thickness of 8 nm stacked in this order from the barrier layer 22 side. Thus, the second embodiment has a structure providing synthetic antiferromagnetic coupling to the reference layer 23 of the magnetic memory according to the first embodiment shown in FIG. 1. With this structure, the leakage magnetic field to adjacent memory elements may be curbed, and the shift of magnetization characteristic of the storage layer included in the same memory element as the reference layer 23 may be prevented.

Figure 5B:
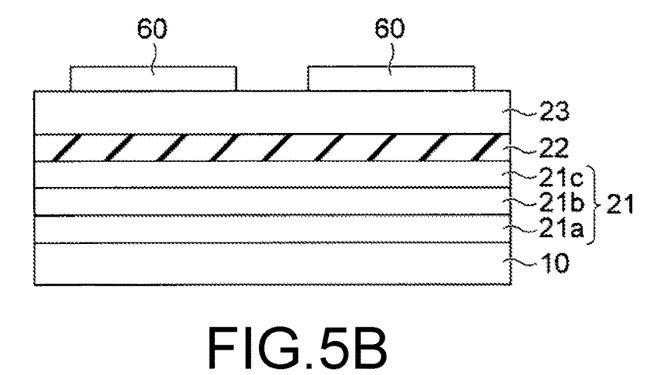
Figure 5C:
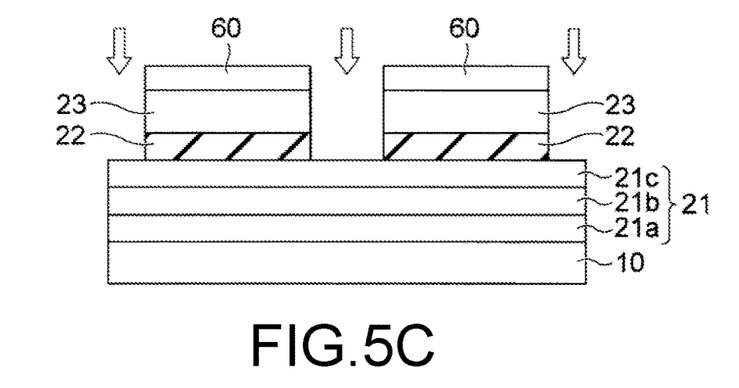

Masks 60 having a shape of the memory elements are then formed, as shown in FIG. 5B. Then, etching is performed to the top portion of the magnetic layer 21c by ion beam etching (IBE) using Ar gas, as shown in FIG. 5C. The top surface of the magnetic layer 21c is disposed between the memory elements.

Figure 5D:
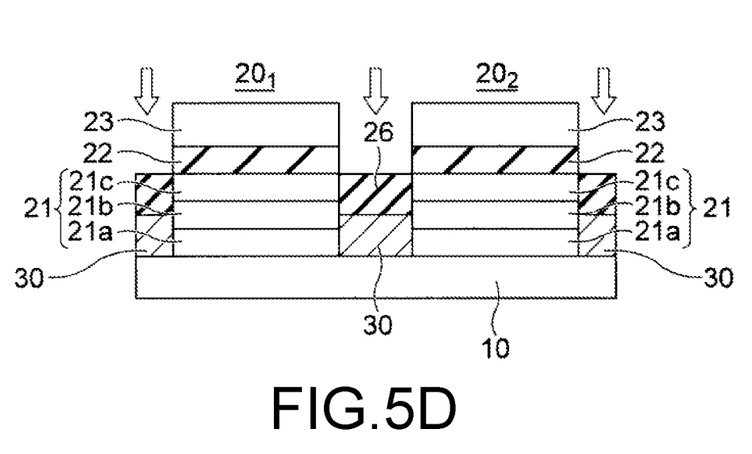

Thereafter, the magnetic layer 21c between the memory elements is oxidized by ion beam treatment (IBT) using oxygen gas to change the magnetic layer 21c to a nonmagnetic layer 26, as shown in FIG. 5D. The nonmagnetic layer 26 thus includes an oxide of the material included in the magnetic layer 21c. As in the case of the second embodiment, Ir included in the nonmagnetic layer 21b, which has a large atomic number, is injected into the magnetic layer 21a and the conductive layer 10. This forms a conductive layer 30 in the area between the memory elements $20_1$ and $20_2$. The conductive layer 30 is disposed between the nonmagnetic layer 26 and the conductive layer 10. Although the magnetic layer 21c is oxidized to obtain the nonmagnetic layer 26 in this embodiment, the magnetic layer 21c between the memory elements may be nitrided to obtain the nonmagnetic layer 26. In this case, the nonmagnetic layer 26 includes a nitride of the material included in the magnetic layer 21c.

Figure 5E:
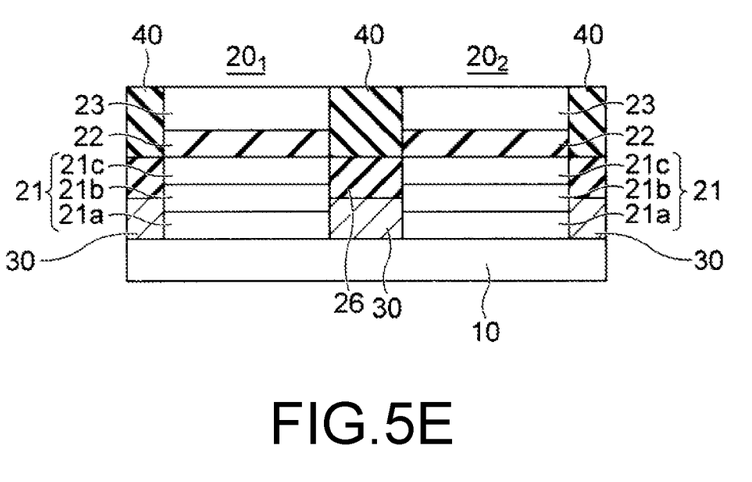

Then, an insulating layer 40 is embedded between the memory elements as shown in FIG. 5E to complete the magnetic memory according to the third embodiment. The insulating layer 40 is disposed on the nonmagnetic layer 26.

The thicknesses of the nonmagnetic layer 21b and the magnetic layer 21a are thin, from less than one nm to several nm, in the third embodiment. Therefore, a better robust property than that of the second embodiment may be obtained at the endpoint of the IBE. Furthermore, the use of the oxygen gas may lead to a decrease in the possibility of short-circuit of the magnetic layer 21c and the reference layer 23 on the side surfaces of the nonmagnetic layer 22.

The magnetic memory manufactured according to the third embodiment may curb the write error rate and the power consumption even if the memory elements are highly integrated, like the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A magnetic memory comprising:
a first terminal and a second terminal;
a first conductive layer, which is nonmagnetic and includes at least a first element, the first conductive layer including a first region, a second region, a third region, a fourth region, and a fifth region, the second region being disposed between the first region and the fifth region, the third region being disposed between the second region and the fifth region, the fourth region being disposed between the third region and the fifth region, the first region being electrically connected to the first terminal, and the fifth region being electrically connected to the second terminal;
a first magnetoresistive element disposed to correspond to the third region, the first magnetoresistive element including a first magnetic layer, a second magnetic layer disposed between the first magnetic layer and the third region and including at least a second element, a first nonmagnetic layer disposed between the first magnetic layer and the second magnetic layer, a second nonmagnetic layer disposed between the second magnetic layer and the first nonmagnetic layer and including at least a third element, and a third magnetic layer disposed between the second nonmagnetic layer and the first nonmagnetic layer;
a second conductive layer disposed to correspond to the second region, electrically connected to the second region, the second magnetic layer, and the second nonmagnetic layer, and including at least the first element, the second element, and the third element; and
a third conductive layer disposed to correspond to the fourth region, electrically connected to the fourth region, the second magnetic layer, and the second nonmagnetic layer, and including at least the first element, the second element, and the third element.

2. The magnetic memory according to claim 1, wherein a sign of spin Hall angle of the second nonmagnetic layer is different from that of the first conductive layer.

3. The magnetic memory according to claim 1, wherein the third element is at least one of Ir, Ru, Pt, Pd, Ag, Au, Cu, Rh, or Bi.

4. The magnetic memory according to claim 1, wherein the second conductive layer is electrically connected to a face of the third magnetic layer on a side of the first region, and the third conductive layer is electrically connected to a face of the third magnetic layer on a side of the fifth region.

5. The magnetic memory according to claim 1, wherein $\rho_{CL1}$ denotes resistivity of the second conductive layer, $\rho_{NM1}$ denotes resistivity of the first nonmagnetic layer, $\beta_{NM2}$ denotes resistivity of the second nonmagnetic layer, $\beta_{LEAD}$ denotes resistivity of the first conductive layer, and $\beta_{CL2}$ denotes resistivity of the third conductive layer, the following formulas are satisfied $$\beta_{NM1} > \beta_{LEAD} > \beta_{CL1} > \beta_{NM2}$$

$$\beta_{NM1} > \beta_{LEAD} > \beta_{CL2} > \beta_{NM2}.$$

6. The magnetic memory according to claim 1, further comprising a second magnetoresistive element,
wherein
the first conductive layer further includes a sixth region disposed between the fourth region and the fifth region, and the second magnetoresistive element is disposed to correspond to the sixth region and including a fourth magnetic layer, a fifth magnetic layer disposed between the fourth magnetic layer and the sixth region and including at least the second element, a third nonmagnetic layer disposed between the fourth magnetic layer and the fifth magnetic layer, a fourth nonmagnetic layer disposed between the fifth magnetic layer and the third nonmagnetic layer and including at least the third element, and a sixth magnetic layer disposed between the fourth nonmagnetic layer and the third nonmagnetic layer.

7. The magnetic memory according to claim 6, wherein the third conductive layer includes a first part, a second part, and a third part, the second part being disposed between the first part and the third part, the first part being disposed on a side of the third region, the third part being disposed on a side of the sixth region, a concentration of the first element in the second part being higher than a concentration of the first element in the first part and a concentration of the first element in the third part, a concentration of the second element in the second part being lower than a concentration of the second element in the first part and a concentration of the second element in the third part, and a concentration of the third element in the second part being lower than a concentration of the third element in the first part and a concentration of the third element in the third part.

8. The magnetic memory according to claim 1, further comprising a first insulating layer and a second insulating layer,
  wherein
    the second conductive layer is disposed between the second region and the first insulating layer, the third conductive layer is disposed between the fourth region and the second insulating layer, and the first insulating layer and the second insulating layer include an oxide or a nitride of an element included in the third magnetic layer.

9. The magnetic memory according to claim 1, wherein saturation magnetization of the third magnetic layer is greater than saturation magnetization of the second magnetic layer.

\* \* \* \* \*